US011776876B2

(12) United States Patent
Eagle et al.

(10) Patent No.: US 11,776,876 B2
(45) Date of Patent: Oct. 3, 2023

(54) DISTRIBUTING HEATSINK LOAD ACROSS A PROCESSOR MODULE WITH SEPARABLE INPUT/OUTPUT (I/O) CONNECTORS

(71) Applicant: INTERNATIONAL BUSINESS MACHINES CORPORATION, Armonk, NY (US)

(72) Inventors: Jason R. Eagle, Mantorville, MN (US); Scott R. Lapree, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/157,545

(22) Filed: Jan. 25, 2021

(65) Prior Publication Data

US 2022/0238416 A1 Jul. 28, 2022

(51) Int. Cl.
*H01L 23/433* (2006.01)
*H01L 23/367* (2006.01)
*H05K 7/14* (2006.01)
*H05K 1/02* (2006.01)
*H01L 23/40* (2006.01)

(52) U.S. Cl.
CPC ........ *H01L 23/4338* (2013.01); *H01L 23/367* (2013.01); *H01L 23/4006* (2013.01); *H05K 1/0203* (2013.01); *H05K 7/1468* (2013.01)

(58) Field of Classification Search
CPC ............... H05K 7/3039; H05K 7/2049; H05K 7/20154; H05K 7/20509; H05K 1/0201–0203; H01L 23/367; H01L 23/40–4006; H01L 23/4093; H01L 23/4081; H01L 23/4087; H01L 2023/4037; H01L 2023/405; H01L 2023/4043; H01L 2023/4062; H01L 2023/4075–4087; H01L 2023/433; H01L 2023/4338; G06F 1/20; G06F 1/203; G01R 1/0458; F16B 21/00
See application file for complete search history.

(56) References Cited

U.S. PATENT DOCUMENTS

| | | | |
|---|---|---|---|
| 4,167,771 A * | 9/1979 | Simons | H01L 23/4338 257/E23.098 |
| 4,235,283 A * | 11/1980 | Gupta | H01L 23/4338 165/185 |
| 4,649,990 A | 3/1987 | Kurihara et al. | |
| 4,884,167 A * | 11/1989 | Mine | H01L 23/4338 361/689 |
| 4,928,207 A * | 5/1990 | Chrysler | H01L 23/427 257/E23.093 |
| 5,705,850 A | 1/1998 | Ashiwake et al. | |
| 5,751,062 A | 5/1998 | Daikoku et al. | |
| 6,219,241 B1 * | 4/2001 | Jones | H05K 7/1007 439/342 |

(Continued)

FOREIGN PATENT DOCUMENTS

EP 1142460 A1 10/2001

*Primary Examiner* — Amir A Jalali
(74) *Attorney, Agent, or Firm* — Nathan M. Rau

(57) ABSTRACT

A heatsink for distributing heatsink load across a processor module with separable input/output (I/O) connectors, comprising: a thermal conductor; and one or more pistons aligned with one or more separable interconnects of the processor module.

17 Claims, 8 Drawing Sheets

(56) References Cited

U.S. PATENT DOCUMENTS

| | | | | |
|---|---|---|---|---|
| 6,504,722 | B2* | 1/2003 | Vittet | H05K 7/20545 |
| | | | | 361/689 |
| 7,480,143 | B2* | 1/2009 | Delano | H01L 23/4338 |
| | | | | 257/713 |
| 8,143,715 | B2* | 3/2012 | Choi | H01L 23/49811 |
| | | | | 257/369 |
| 10,104,758 | B2 | 10/2018 | Kuganesan et al. | |
| 2001/0046121 | A1* | 11/2001 | Vittet | H05K 7/20545 |
| | | | | 361/704 |
| 2002/0017715 | A1 | 2/2002 | Giacomo et al. | |
| 2002/0114137 | A1* | 8/2002 | Pearson | H01L 23/4093 |
| | | | | 174/15.2 |
| 2004/0207985 | A1* | 10/2004 | Delano | H01L 23/4338 |
| | | | | 257/706 |
| 2007/0030656 | A1* | 2/2007 | Ross | H05K 7/2049 |
| | | | | 361/710 |
| 2015/0245464 | A1* | 8/2015 | Kuganesan | H01L 23/36 |
| | | | | 361/717 |
| 2016/0360645 | A1* | 12/2016 | Achard | H05K 7/2039 |

* cited by examiner

DISTRIBUTING HEATSINK LOAD ACROSS A PROCESSOR MODULE WITH SEPARABLE INPUT/OUTPUT (I/O) CONNECTORS

BACKGROUND

Field of the Invention

The field of the invention is heatsink connection, or, more specifically, methods and apparatus for distributing heatsink load across a processor module with separable input/output (I/O) connectors.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Some processor modules incorporate high speed separable interconnects that are coupled to the top face of a processor laminate. These separable interconnects must be mated after the processor module is installed in the system. The processor module lid is truncated to allow for the high speed separable interconnects, and the mated connectors are taller than the lid of the processor module. As there are input/output contacts beneath the area of the processor module populated by the separable interconnects, a heatsink needs to provide load over the connector area. Accordingly, a heatsink needs to provide load across the connector area and also account for the variation in height between the processor module lid and the mated I/O interconnects.

SUMMARY

A heatsink for distributing heatsink load across a processor module with separable input/output (I/O) connectors, includes: a thermal conductor; and one or more pistons aligned with one or more separable interconnects of the processor module. The one or more pistons provide a distributed load across the heatsink and allow for even load distribution that accounts for variations in height between a processor lid and mated interconnects of the processor module. In some embodiments, the pistons include spring-loaded pistons. This provides the technical advantage of the pistons providing pressure to the separable interconnects of the processor module that is proportional to the height of the separable interconnects. In some embodiments, the heatsink one or more retention plates having one or more openings allowing for partial passage of the one or more pistons. This provides the advantage of allowing the pistons to move within the heatsink to account for the height variations of the couplable interconnects, while also preventing the pistons and springs from being dislodged from the heatsink. In some embodiments, an apparatus includes a processor module including one or more separable interconnects and a heatsink described above. In some embodiments, a method for distributing heatsink load across a processor module with separable input/output (I/O) connectors includes: aligning one or more pistons of the heatsink with one or more separable interconnects of the processor module; and thermally coupling a thermal conductor of the heatsink to the processor module The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Some processor modules incorporate high speed separable interconnects that are coupled to the top face of a processor laminate. These separable interconnects must be mated after the processor module is installed in the system. The processor module lid is truncated to allow for the high speed separable interconnects, and the mated connectors are typically taller than the lid of the processor module. As there are input/output contacts beneath the area of the processor module populated by the separable interconnects, a heatsink needs to provide load over the connector area. Accordingly, a heatsink needs to provide load across the connector area and also account for the variation in height between the processor module lid and the mated I/O interconnects.

Figure 1:
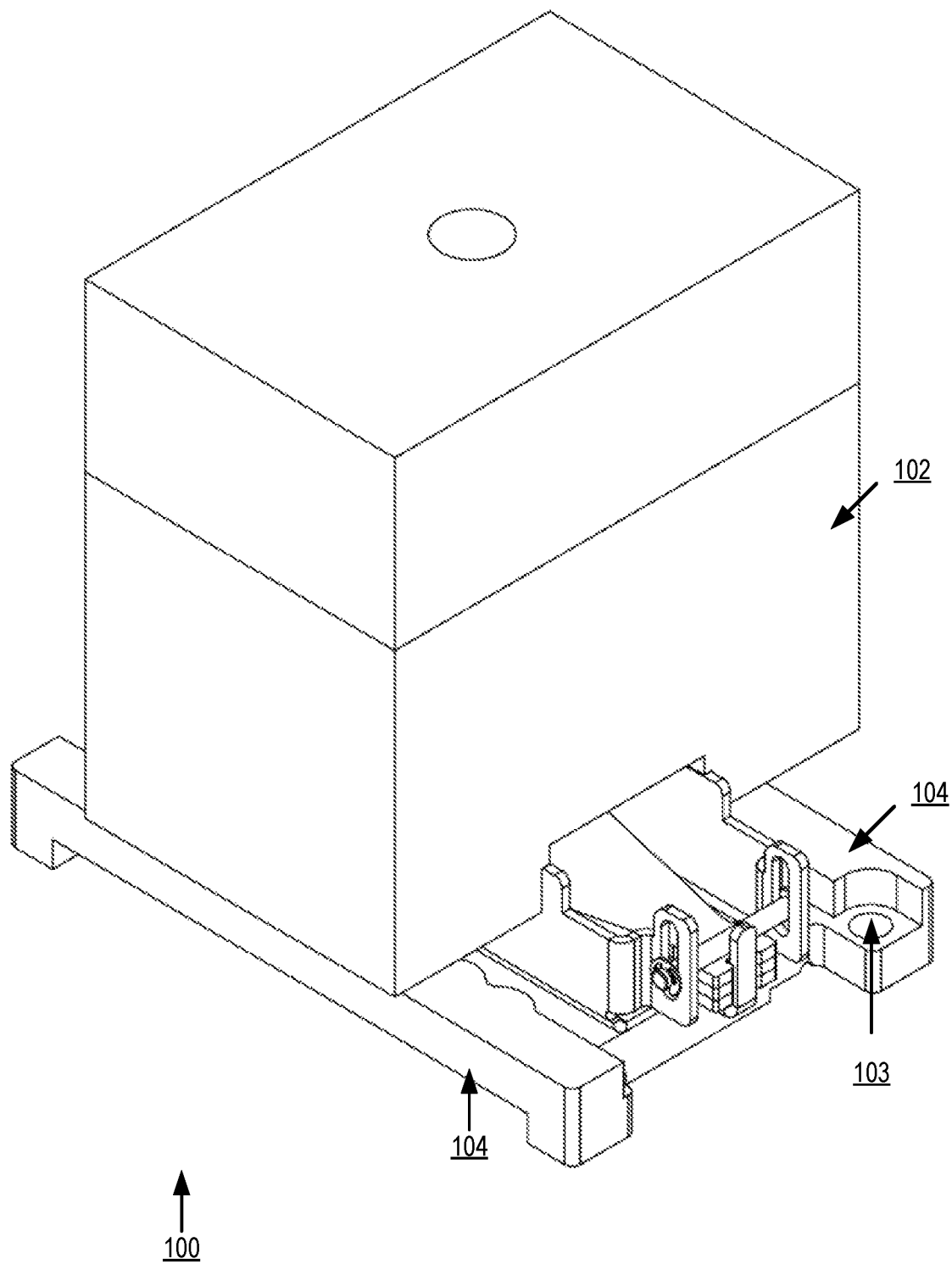
FIG. 1 is an example view of a heatsink for distributing heatsink load across a processor module with separable input/output (I/O) connectors according to embodiments of the present disclosure.

To address these needs, FIG. 1 shows an example heatsink 100 for distributing heatsink load across a processor module with separable input/output (I/O) connectors according to embodiments of the present disclosure. The heatsink 100 includes a thermal conductor 102. The thermal conductor 102 includes panes, plates, or other configurations of thermally conductive material such as thermally conductive metal including aluminum or aluminum alloys. The thermal conductor 102 channels heat generated by a processor module into another medium such as air, liquid, or another medium as can be appreciated. Although not shown, the heatsink 100 may include other components to facilitate heat conduction and dissipation, including fans, liquid cooling apparatuses, or other components. One skilled in the art will appreciate that the thermal conductor 102 configuration shown is merely exemplary, and that the approaches set forth herein are applicable to other configurations of thermal conductors 102 or heatsinks 100. The heatsink 100 also includes attachment holes 103 facilitating attachment of the heatsink 100 to a processor module, motherboard, socket, or other component through the use of screws, bolts, or other interconnects as can be appreciated.

The heatsink 100 also includes piston assemblies 104. Each piston assembly 104 includes one or more pistons aligned with separable interconnects of a processor module to which the heatsink 100 is couplable. When the heatsink 100 is thermally coupled to a processor module, the pistons of the piston assemblies 104 apply pressure to the aligned separable interconnects. For example, the pistons include spring-loaded pistons such that each piston will apply pressure proportional to the height of the separable interconnect in contact with the piston. The use of spring-loaded pistons will allow for the heatsink 100 to be coupled to processor modules with separable interconnects having heights different than a processor lid of the processor module. Moreover, the use of spring-loaded pistons allows for compatibility with separable interconnects of a variety of heights. The piston assemblies 104, as well as the pistons and other components of the piston assemblies 104, may be made of conductive material. Thus, the piston assemblies 104 provide additional thermal conductivity to the thermal conductor 102 of the heatsink 100.

Figure 2:
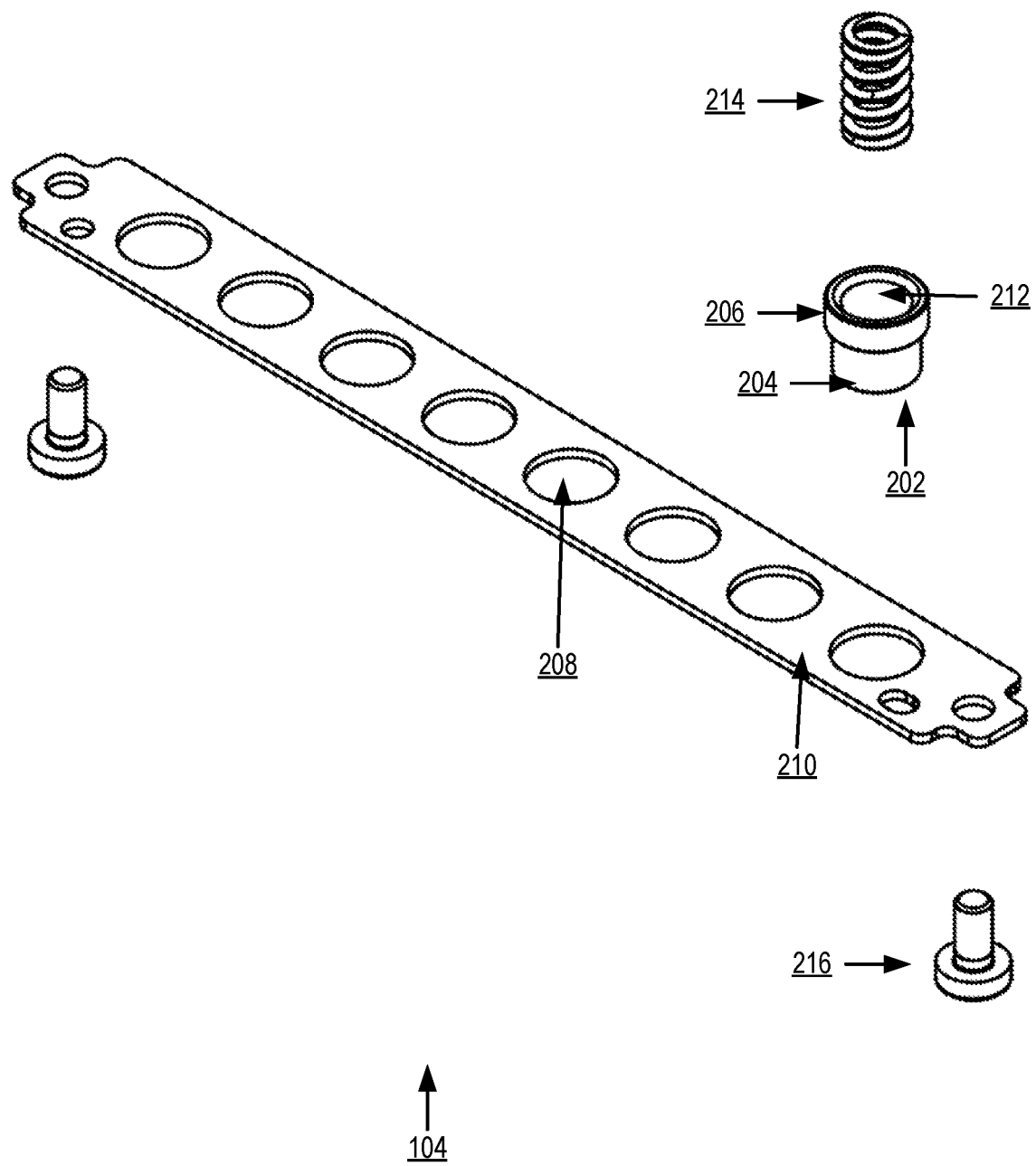
FIG. 2 is an example view of piston assembly components of a heatsink for distributing heatsink load across a processor module with separable input/output (I/O) connectors according to embodiments of the present disclosure.

FIG. 2 shows a view of the internal components of a piston assembly 104. Each piston assembly 104 includes a plurality of pistons 202. Each piston 202 includes a first portion 204 of a first diameter and a second portion 206 of a second diameter. The diameter of the first portion 204 is of a diameter less than or equal to the diameter of a corresponding opening 208 in a retention plate 210. Thus, the first portion 204 of a piston 202 is passable through the opening 208 in the retention plate 210. The diameter of the second portion 206 is greater than the diameter of the opening 208 such that the second portion 206 is impassible through the opening 208. Each piston 202 also includes a cavity 212 into which a spring 214 may be housed. When assembled into a piston assembly 104, the spring 214 will provide pressure on the inner facing of the piston 202 cavity 212 and pressure on an inner surface of the piston assembly 104, such as an inner surface of a cavity of the piston assembly 104 housing both a piston 202 and spring 214. Although FIG. 2 shows a single piston 202 and spring 214, it is understood that this is merely for clarity and that an assembled piston assembly 104 will likely include many pistons 202 corresponding to a number of openings 208 in a retention plate 210.

Figure 3:
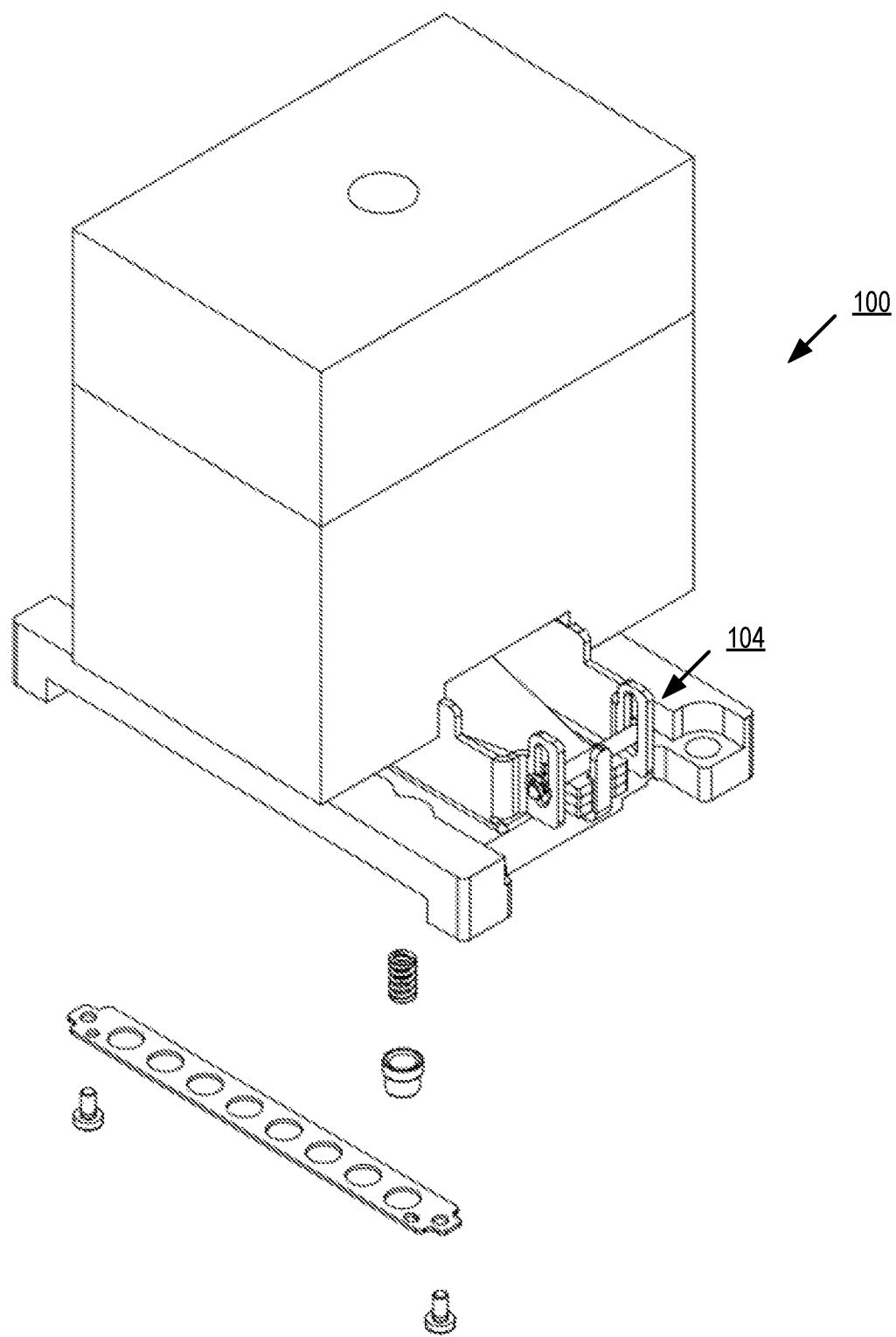
FIG. 3 is another example view of a heatsink for distributing heatsink load across a processor module with separable input/output (I/O) connectors according to embodiments of the present disclosure.

The retention plate 210 is a plate or plane of material with one or more openings 208 allowing partial passage of pistons 202. As is set forth above, as each piston 202 is restricted from passing completely though the holes of the retention plate 210, the retention plate 210 contains the pistons 202 and springs 214 within the spring assembly 104. The retention plate 210 may be secured to a shell or frame of the piston assembly 104 (not shown) using screws 216 or other interconnects as can be appreciated. FIG. 3 shows how the disassembled components of the piston assembly 104 align for assembly in the example heatsink 100.

Figure 4:
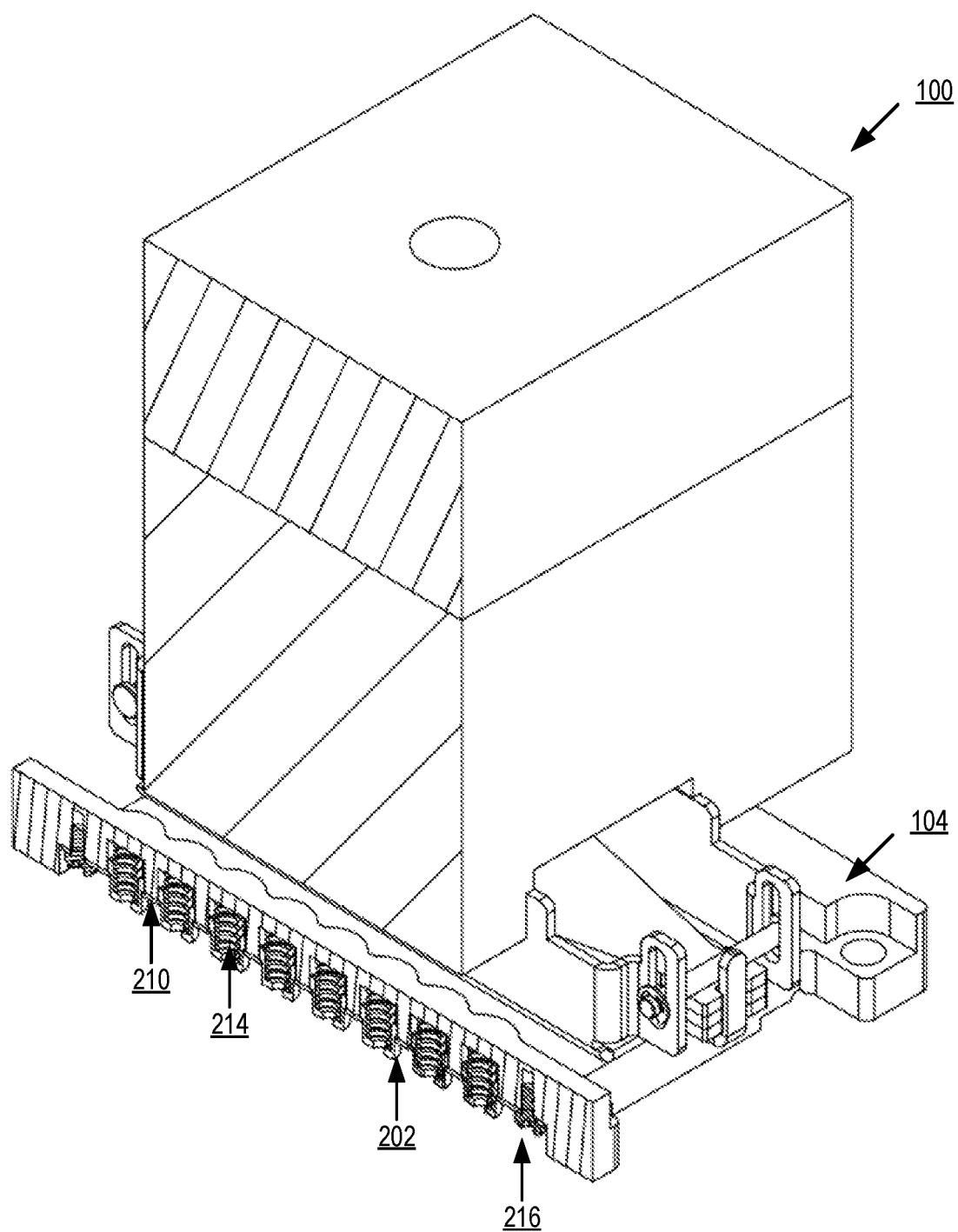
FIG. 4 is another example view of a heatsink for distributing heatsink load across a processor module with separable input/output (I/O) connectors according to embodiments of the present disclosure.
Figure 5:
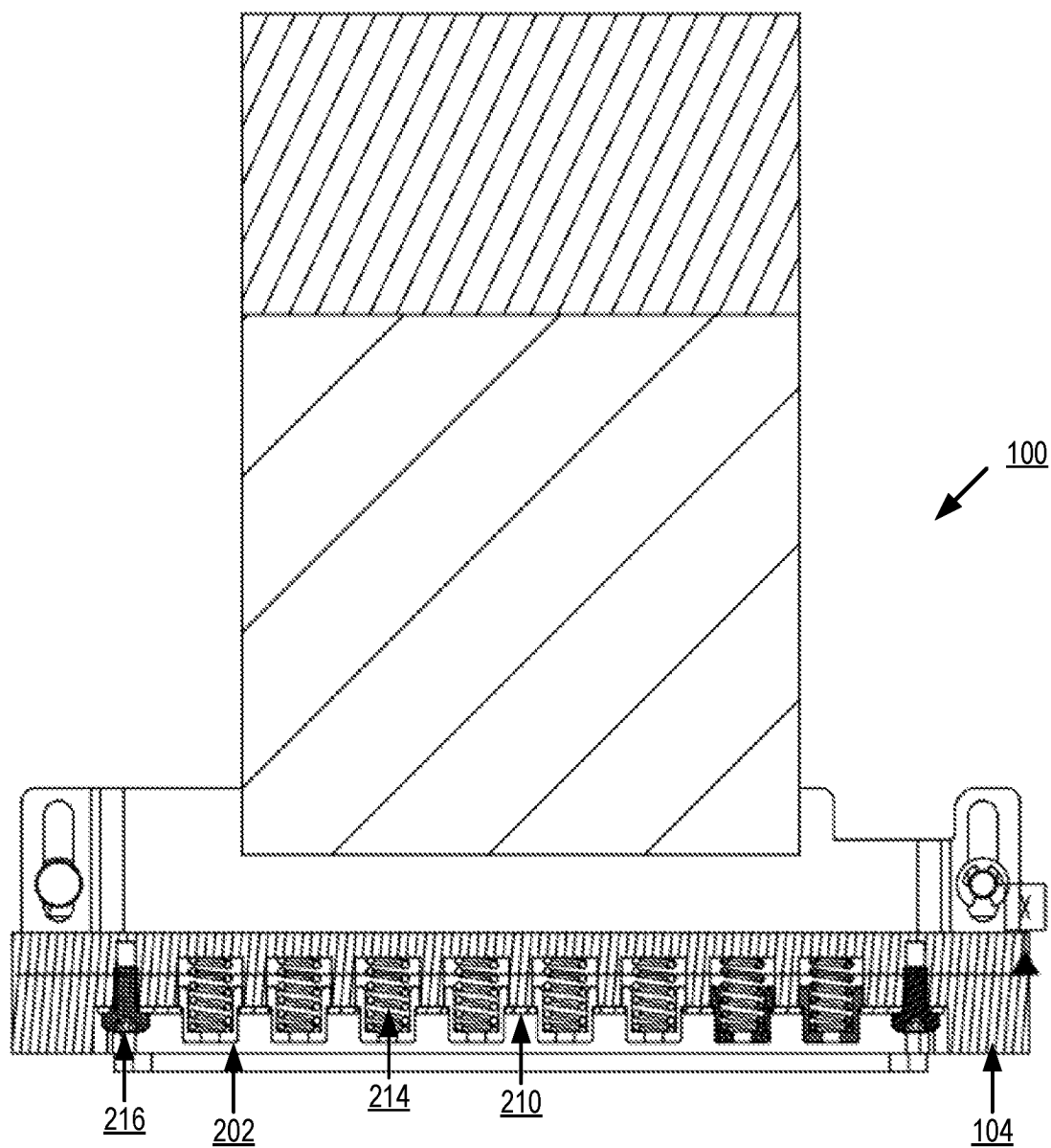
FIG. 5 is an example view of a heatsink for distributing heatsink load across a processor module with separable input/output (I/O) connectors according to embodiments of the present disclosure.

FIG. 4 and FIG. 5 show alternative views of the example heatsink 100 with a cross sectional view of the piston assembly 104. As shown, each piston assembly 104 includes a plurality of cavities each housing a piston 202 and spring 214. Each spring 214 is further housed within a cavity of the corresponding piston 202. The springs 214 and pistons 202 are held in place by a retention plate 210 that is secured to the piston assemblies 104 by screws 216. The piston assemblies 104 each include an array of cavities, thereby including an array of pistons 202 and springs 214. One skilled in the art will appreciate that other configurations and arrangements of pistons 202 and springs 214 are possible and contemplated within the scope of the present embodiments. For example, the particular arrangement of pistons 202 and springs 214 will correspond to an arrangement of separable interconnects of a processor module to which the heatsink 100 will be thermally coupled such that the pistons 202 are aligned with the separable interconnects.

Figure 6:
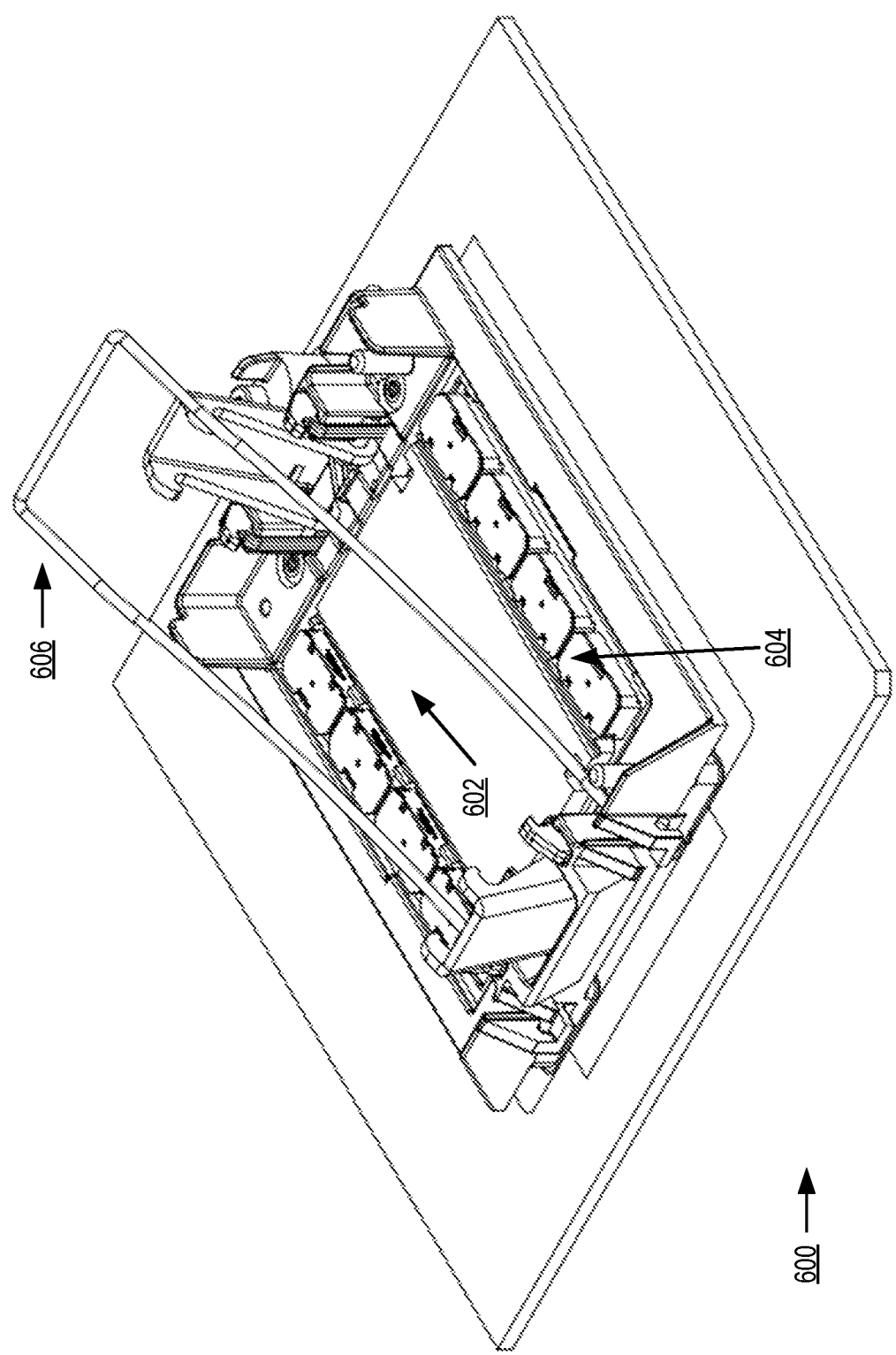
FIG. 6 is an example view of an apparatus including a processor module compatible with a heatsink for distributing heatsink load across a processor module with separable input/output (I/O) connectors according to embodiments of the present disclosure.

FIG. 6 shows an example apparatus 600 into which the heatsink 100 may be installed. The apparatus 600 includes a processor module 602. The processor module 602 includes a chip or processor such as a central processing unit (CPU). For example, the processor module 602 includes a land-grid array (LGA) package for an LGA socket.

The processor module 602 includes a plurality of separable interconnects 604. The separable interconnects 604 include plugs or sockets that can be mated with other components to form a high-speed input/output (I/O) to the processor module 602. For example, the separable interconnects 604 may include Nearstack or other on-the-substrate (OTS) connectors. The separable interconnects 604 are coupled directly to a processor module 602 laminate. In this example, the separable interconnects 604 are arranged as two rows or arrays of separable interconnects 604. One skilled in the art will appreciate that other configurations or arrangements of separable interconnects 604 are also possible and contemplated within the scope of the present disclosure.

The apparatus 600 also includes a retention bail 606. The retention bail 606 includes one or more rigid components that, when engaged, restricts the movement of the processor module 602. In the example apparatus 600, the retention bail 606 includes two parallel portions connected by a perpendicular portion. The retention bail 606 may be engaged with one or more grooves of the apparatus 600 (not shown) or other engaging components. The retention bail 606 may be spring loaded or otherwise actuated to provide a retaining force to the processor module 602 when engaged.

One skilled in the art will appreciate that, where the processor module 602 is installed in an LGA socket, the LGA contacts push upwards against the I/O pads on the base of the processor module 602 laminate. Without the downward force applied by the apparatus 600 on the separable interconnects 604, the forces would be unbalanced and would result in the processor module 602 laminate being stressed to resolve the load. This would cause the laminate to deflect upward on the areas where the separable interconnects 604 are located, reducing the LGA contact load and potentially damaging the laminate. Accordingly, the apparatus 600 balances the LGA contact load and prevents damage on the laminate. One skilled in the art will also appreciate that the apparatus 600 provides such an advantage on any socket whose contacts push upwards against I/O pads of a laminate similar to an LGA socket.

Figure 7:
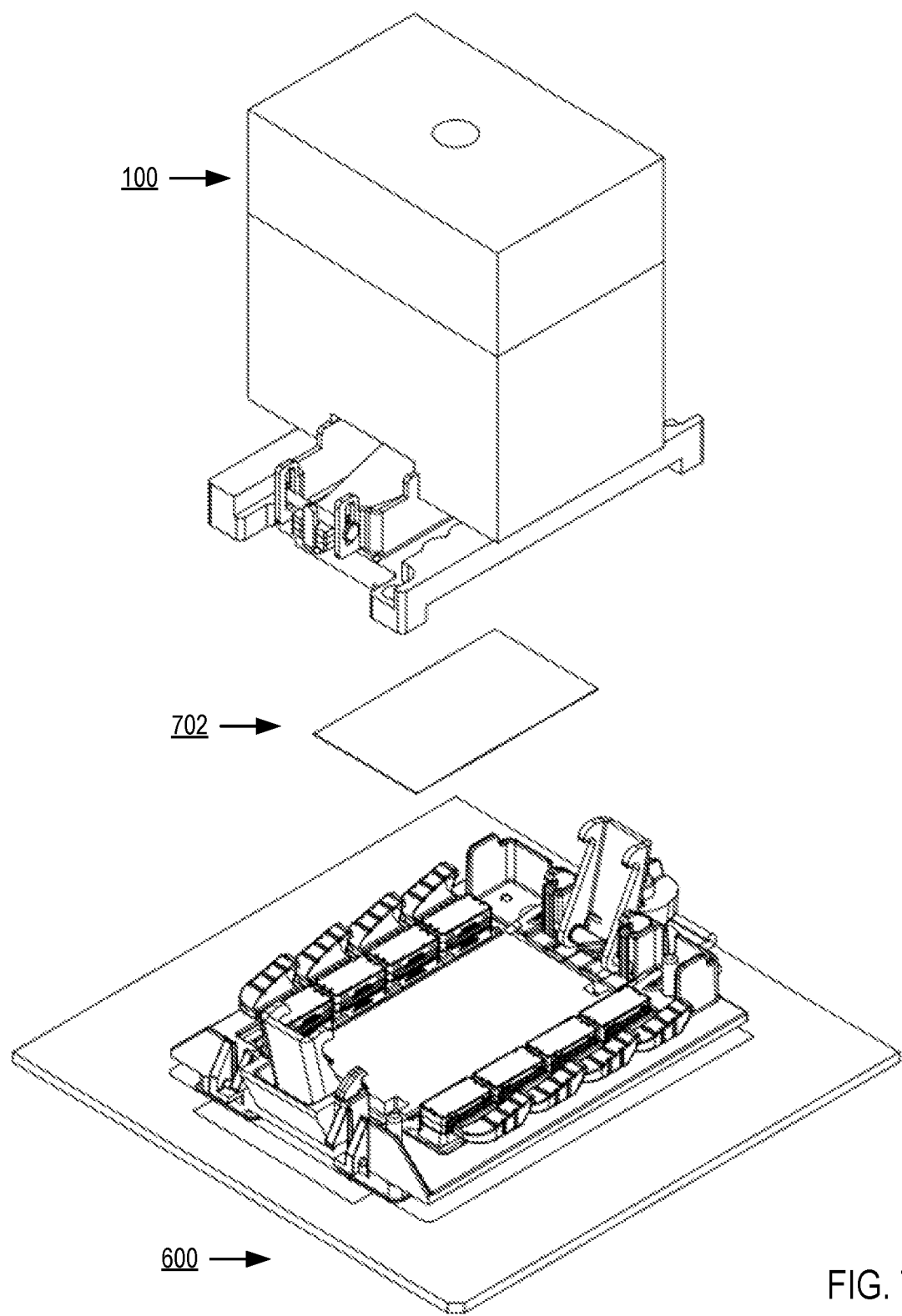
FIG. 7 is an example view a heatsink for distributing heatsink load across a processor module with separable input/output (I/O) connectors aligned for installation according to embodiments of the present disclosure.

FIG. 7 shows an example view of a heatsink 100 aligned for installation in an apparatus 600. A processor lid 702 is placed between a surface of the processor module 602 and the heatsink 100. The processor lid 702 is truncated to only cover the portion of the processor module 602 not covered by the separable interconnects 604. As shown in FIG. 7, the separable interconnects 604 are mated such that the mated separable interconnects 604 and the processor lid 702 rest at different heights. As such, the pistons 202 of the piston assembly 104 may rest at heights and apply pressure based on the height of the separable interconnects 604 to which they are aligned.

Figure 8:
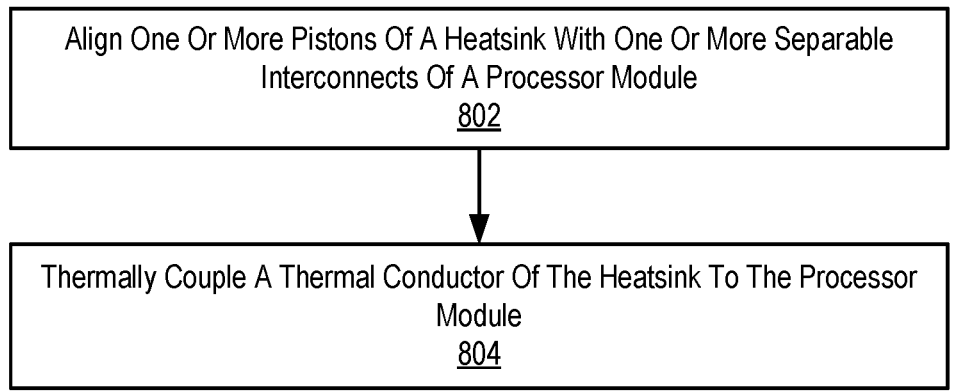
FIG. 8 is an example view of an apparatus including a processor module compatible with a heatsink for distributing heatsink load across a processor module with separable input/output (I/O) connectors according to embodiments of the present disclosure.

For further explanation, FIG. 8 sets forth a flow chart illustrating an exemplary method for distributing heatsink load across a processor module with separable input/output (I/O) connectors according to embodiments of the present invention that includes aligning 802 one or more pistons 202 of a heatsink 100 with one or more separable interconnects 604 of a processor module 602. The separable interconnects 604 include plugs or sockets that can be mated with other components to form a high-speed input/output (I/O) to the processor module 602. For example, the separable interconnects 604 may include Nearstack or other on-the-substrate (OTS) connectors. The separable interconnects 604 are coupled directly to a processor module 602 laminate. The separable interconnects 604 may be arranged as rows or arrays of separable interconnects 604. The separable interconnects 604 may also be arranged according to other configurations.

In some embodiments, the pistons 202 are housed within a piston assembly 104 of the heatsink. In some embodiments, each piston 202 includes a first portion 204 of a first diameter and a second portion 206 of a second diameter. The diameter of the first portion 204 is of a diameter less than or equal to the diameter of a corresponding opening 208 in a retention plate 210. Thus, the first portion 204 of a piston 202 is passable through the opening 208 in the retention plate 210. The diameter of the second portion 206 is greater than the diameter of the opening 208 such that the second portion 206 is impassible through the opening 208.

In some embodiments the pistons 202 are spring-loaded pistons. Accordingly, in some embodiments, each piston 202 also includes a cavity 212 into which a spring 214 may be housed. When assembled into a piston assembly 104, the spring 214 will provide pressure on the inner facing of the piston 202 cavity 212 and pressure on an inner surface of the piston assembly 104, such as an inner surface of a cavity of the piston assembly 104 housing both a piston 202 and spring 214. Aligning 802 the one or more pistons 202 with the one or more separable interconnects 604 of the processor module 602 causes the pistons 202 to contact with the separable interconnects 604 after installation of the heatsink 100.

The method of FIG. 8 also includes thermally coupling 804 a thermal conductor 102 of the heatsink 100 to the processor module 602. In some embodiments, thermally coupling 804 a thermal conductor 102 of the heatsink 100 to the processor module 602 includes installing or attaching the heatsink 100 to an apparatus 600 housing the processor module 602. For example, the heatsink 100 mat be attached to the apparatus 600 using clips, clamps, screws, or other interconnects as can be appreciated.

In some embodiments, thermally coupling 804 a thermal conductor 102 of the heatsink 100 to the processor module 602 includes applying thermally conductive materials between the processor module 602, or a processor lid 702 of the processor module 602, and the heatsink 100. Examples of the thermally conductive materials include thermally conductive paste, pads, or other materials.

When the heatsink 100 is thermally coupled 804 to the processor module 602 by virtue of installation in an apparatus 600 housing the processor module 602, the pistons 202 of the heatsink 100 apply pressure to the separable interconnects 604 of the processor module 602. Due to the pistons 202 being spring loaded, the pistons 202 apply pressure proportional to the height of the separable interconnects 604. Where the separable interconnects 604 and processor lid 702 vary in height, the spring loaded pistons 202 provide for even load distribution across the processor module 602, including the separable interconnects 604.

In view of the explanations set forth above, readers will recognize that the benefits of distributing heatsink load across a processor module with separable input/output (I/O) connectors according to embodiments of the present invention include:

Improved operation of a heatsink thermally coupled to a processor by providing for even load distribution across the processor module and separable interconnects attached to the processor module.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A heatsink for distributed load over a processor module with one or more separable input/output (I/O) interconnects, comprising:
    a thermal conductor; and
    one or more pistons comprising one or more spring-loaded pistons, wherein each of the one or more pistons is positionally aligned with a corresponding separable I/O interconnect of the one or more separable I/O interconnects of the processor module, and wherein the one or more pistons are configured to touch the one or more separable I/O interconnects of the processor module.

2. The heatsink of claim 1, wherein the one or more pistons comprise a plurality of pistons arranged in a plurality of arrays, and wherein each separable I/O interconnect of the one or more separable I/O interconnects corresponds with a different piston of the one or more pistons touching the separable I/O interconnect.

3. The heatsink of claim 1, further comprising one or more cavities housing the one or more pistons, and wherein the one or more separable I/O interconnects of the processor module are configured to couple to a computing module to form an I/O to the processor module.

4. The heatsink of claim 3, further comprising one or more retention plates retaining the one or more pistons in the one or more cavities.

5. The heatsink of claim 4, wherein the one or more retention plates comprise one or more openings allowing for partial passage of the one or more pistons.

6. The heatsink of claim 5, wherein each piston comprises:

a first portion passable through an opening of the one or more openings; and a second portion impassible through the opening of the one or more openings.

7. An apparatus for distributed load over a processor module with separable input/output (I/O) connectors, comprising:

the processor module comprising one or more separable I/O interconnects; and a heatsink comprising:

a thermal conductor; and one or more pistons comprising one or more spring-loaded pistons, wherein each of the one or more pistons is aligned with a corresponding separable I/O interconnect of the one or more separable I/O interconnects of the processor module, and wherein the one or more pistons are configured to touch the one or more separable I/O interconnects of the processor module.

8. The apparatus of claim 7, wherein the one or more pistons comprise a plurality of pistons arranged in a plurality of arrays.

9. The apparatus of claim 7, wherein the heatsink further comprises one or more cavities housing the one or more pistons.

10. The apparatus of claim 9, wherein the heatsink further comprises one or more retention plates retaining the one or more pistons in the one or more cavities.

11. The apparatus of claim 10, wherein the one or more retention plates comprise one or more openings allowing for partial passage of the one or more pistons.

12. The apparatus of claim 11, wherein each piston comprises:

a first portion passable through an opening of the one or more openings; and a second portion impassible through the opening of the one or more openings.

13. The apparatus of claim 7, wherein the processor module comprises a processor lid at a first height, and wherein the one or more separable I/O interconnects are at a second height different than the first height, and wherein the one or more pistons of the heatsink provide even load distribution of the heatsink across the processor module, including the separable interconnects, the heatsink touching the processor lid and the one or more separable I/O interconnects.

14. The apparatus of claim 7, further comprising:

one or more grooves; and a retention bail engageable with the one or more grooves that, when engaged, restricts movement of the processor module.

15. A method for coupling a heatsink for distributed load to a processor module with separable I/O connectors, comprising:

aligning each of one or more pistons of the heatsink with a corresponding separable I/O interconnect of one or more separable I/O interconnects of the processor module, wherein the one or more pistons comprise one or more spring-loaded pistons, and wherein the one or more pistons are configured to touch the one or more separable I/O interconnects of the processor module; and thermally coupling a thermal conductor of the heatsink to the processor module.

16. The method of claim 15, wherein the one or more pistons comprise a plurality of pistons arranged in a plurality of arrays.

17. The method of claim 15, wherein the heatsink further comprises one or more cavities housing the one or more pistons.

* * * * *